United States Patent
Guthrie et al.

(10) Patent No.: US 7,217,666 B2
(45) Date of Patent: May 15, 2007

(54) REACTIVE ION MILLING/RIE ASSISTED CMP

(75) Inventors: Hung-Chin Guthrie, Saratoga, CA (US); Ming Jiang, San Jose, CA (US); Jerry Lo, San Jose, CA (US); Aron Pentek, San Jose, CA (US); Yi Zheng, San Ramon, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 212 days.

(21) Appl. No.: 10/792,330

(22) Filed: Mar. 2, 2004

(65) Prior Publication Data

US 2005/0193550 A1 Sep. 8, 2005

(51) Int. Cl.
*H01L 21/461* (2006.01)
(52) U.S. Cl. .................. 438/738; 438/3; 438/64; 438/712; 257/E21.218; 360/97.01; 360/125; 29/603.07; 29/603.16
(58) Field of Classification Search .............. 438/3, 438/64, 712, 738; 257/E21.218; 360/97.01, 360/125; 29/603.07, 603.16
See application file for complete search history.

(56) References Cited

U.S. PATENT DOCUMENTS

| | | | |
|---|---|---|---|
| 6,330,743 B1* | 12/2001 | Iijima et al. | 29/603.14 |
| 6,377,423 B2 | 4/2002 | Dill, Jr. et al. | 360/126 |
| 6,515,826 B1* | 2/2003 | Hsiao et al. | 360/126 |
| 6,557,242 B1 | 5/2003 | Santini | 29/603.14 |
| 6,604,275 B1 | 8/2003 | Mino et al. | 29/603.15 |
| 6,762,910 B1* | 7/2004 | Knapp et al. | 360/126 |
| 7,086,139 B2* | 8/2006 | Lee et al. | 29/603.07 |
| 7,127,801 B2* | 10/2006 | Lahiri et al. | 29/603.16 |
| 2001/0005297 A1* | 6/2001 | Otsuka | 360/126 |
| 2002/0012195 A1* | 1/2002 | Lahiri et al. | 360/97.01 |
| 2002/0018318 A1 | 2/2002 | Narumi et al. | 360/126 |
| 2002/0071209 A1* | 6/2002 | Watanabe et al. | 360/126 |
| 2002/0191350 A1 | 12/2002 | Santini | 360/317 |
| 2003/0169534 A1 | 9/2003 | Santini | 360/126 |
| 2005/0057851 A1* | 3/2005 | Oike et al. | 360/110 |
| 2005/0234659 A1* | 10/2005 | Lin et al. | 702/46 |
| 2006/0174474 A1* | 8/2006 | Le | 29/603.12 |

* cited by examiner

*Primary Examiner*—Michelle Estrada
*Assistant Examiner*—Jarrett J. Stark
(74) *Attorney, Agent, or Firm*—Zilka-Kotab, PC (57) ABSTRACT

A method for forming a high aspect ratio magnetic structure in a magnetic write head using a combination of chemical mechanical polishing and reactive ion etching.

17 Claims, 11 Drawing Sheets

REACTIVE ION MILLING/RIE ASSISTED CMP

FIELD OF THE INVENTION

The present invention relates to magnetic recording and more particularly to a method of manufacturing an inductive write head having a very small, well defined trackwidth, and having a high aspect ratio P2 pedestal.

BACKGROUND OF THE INVENTION

Computer systems generally utilize auxiliary memory storage devices having media on which data can be written and from which data can be read for later use. A direct access storage device (DASD) such as a disk drive incorporating a rotating magnetic disks is commonly used for storing data in magnetic form on the disk surfaces. Data is recorded on concentric, radially spaced tracks on the disk surfaces, and magnetic heads are used to write the data to and read the data from the tracks on the disk surfaces.

Data is written onto a disk by a write head that includes a magnetic yoke having a coil, passing there through. When current flows through the coil, a magnetic flux is induced in the yoke, which causes a magnetic field to fringe out at a write gap in a pole tip region. It is this magnetic field that writes data, in the form of magnetic transitions, onto the disk. Currently, such heads are thin film magnetic heads, constructed using material deposition techniques such as sputtering and electroplating, along with photolithographic techniques that include the use of photoresist masks.

Examples of such thin film heads include a first magnetic pole, formed of a material such as NiFe which might be plated onto a substrate after sputter depositing an electrically conductive seed layer. Opposite the pole tip region, at a back end of the magnetic pole, a magnetic back gap can be formed. A back gap is the term generally used to describe a magnetic structure that magnetically connects first and second poles to form a completed magnetic yoke as will be described.

One or more electrically conductive coils can be formed over the first pole, between the pedestal and the back gap and can be electrically isolated from the pole and yoke by an insulation layer, which could be alumina ($Al_2O_3$) or hard baked photoresist.

A P2 pedestal is often formed above the first pole in the pole tip region, and is separated from the first pole by a non-magnetic write gap layer. This P2 pedestal extends to the ABS of the head and defines the track width of the head. This pedestal is also used to define the width of a self aligned notch, or pedestal, on the first pole. This is achieved by using the P2 pedestal as a mask and then ion milling through the write gap layer and into a portion of the first pole. An angled ion milling operation can then be performed to removed redeposited material from the sides of the notch or pedestal formed on the first pole. A second pole formed over the P2 pedestal completes the magnetic yoke, being magnetically connected with the first pole by the write gap and stitched to the P2 pedestal.

As those skilled in the art will appreciate, the P2 pole or pedestal is a critical element of the write head. This is because it defines the track width. Also it must be constructed of a material that has high saturation, and low coercivity. It must have a high aspect ratio so that it will be narrow enough to provide the necessary small track width while being tall enough (in the track width direction) to provide sufficient overwrite performance. This P2 pedestal becomes the focal point for the magnetic flux in the write head.

Traditionally, such P2 pedestals have been constructed by forming a photoresist frame having a trench in which the P2 pedestal is plated. The photoresist frame use to form the P2 pedestal has currently been constructed using Deep U.V. photolithography. Deep U.V. lithography provides better resolution and would provide better track width control, but have some limitation to pattern very thick photoresist frame.

Figure 1A:
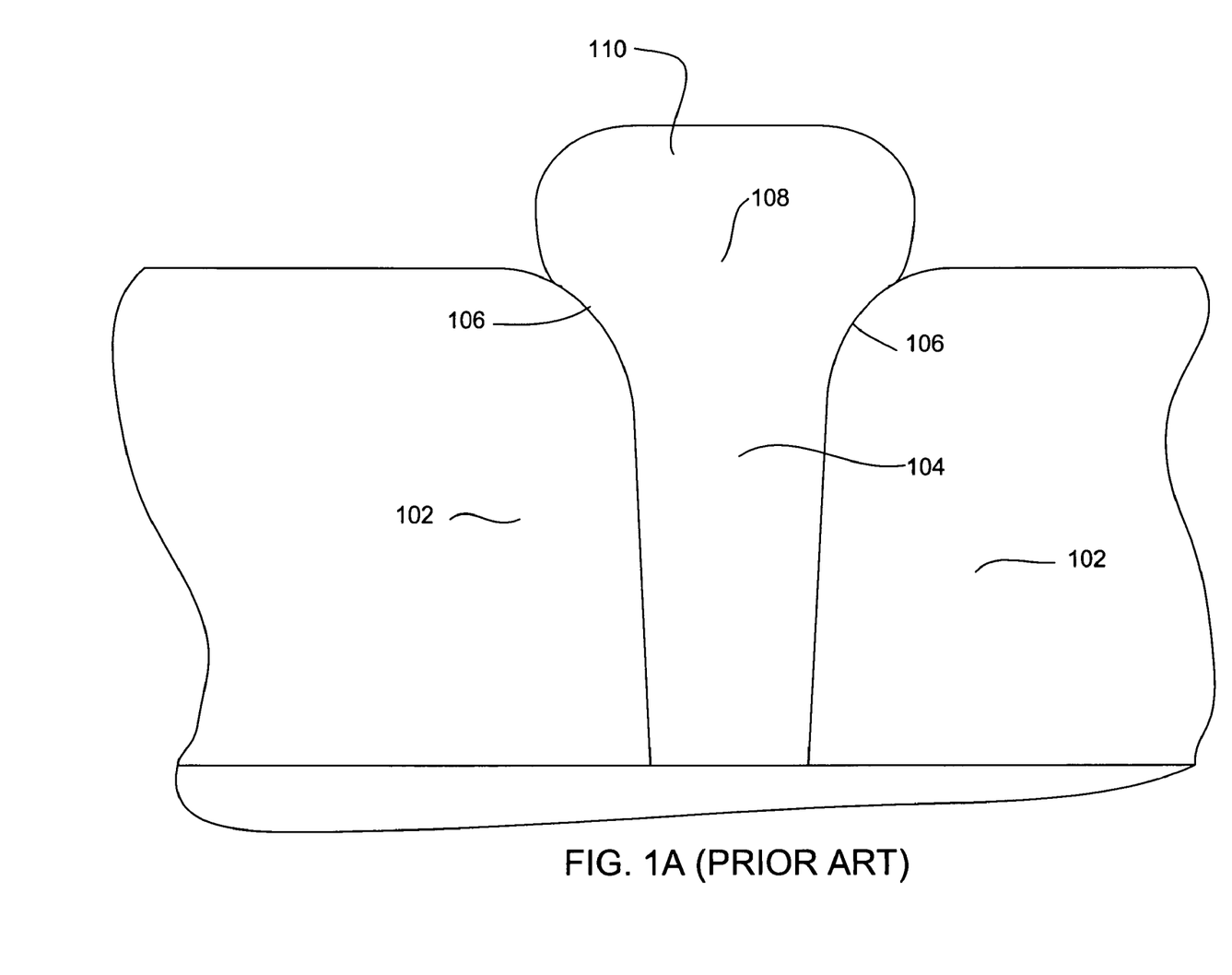
FIG. 1A is an ABS view of a prior art P2 pedestal of a magnetic head in an intermediate stage of manufacture.

With reference to FIG. 1A, using Deep U.V. photolithography, a photoresist frame 101 is constructed that has a trench 102 in which the P2 pedestal 104 can be plated. Due to the nature of the photolithographic process used, the trench has a relatively constant width (low sigma) at its lower and center portions, but widens significantly at its upper portion, forming a flare 106. Magnetic material 108 is plated into the trench 104, and forms a bulb 110 at its top due to the flare 106 of the trench and due to the height to which the magnetic material 110 must be plated. It should be pointed out, that due to the chemical mechanical polishing process used, the magnetic material, must be plated much higher than would otherwise be necessary, for example 0.8 microns higher than the height of the finished P2. After, the magnetic material 110 has been deposited, the photoresist frame 102 can be lifted off.

Figure 1B:
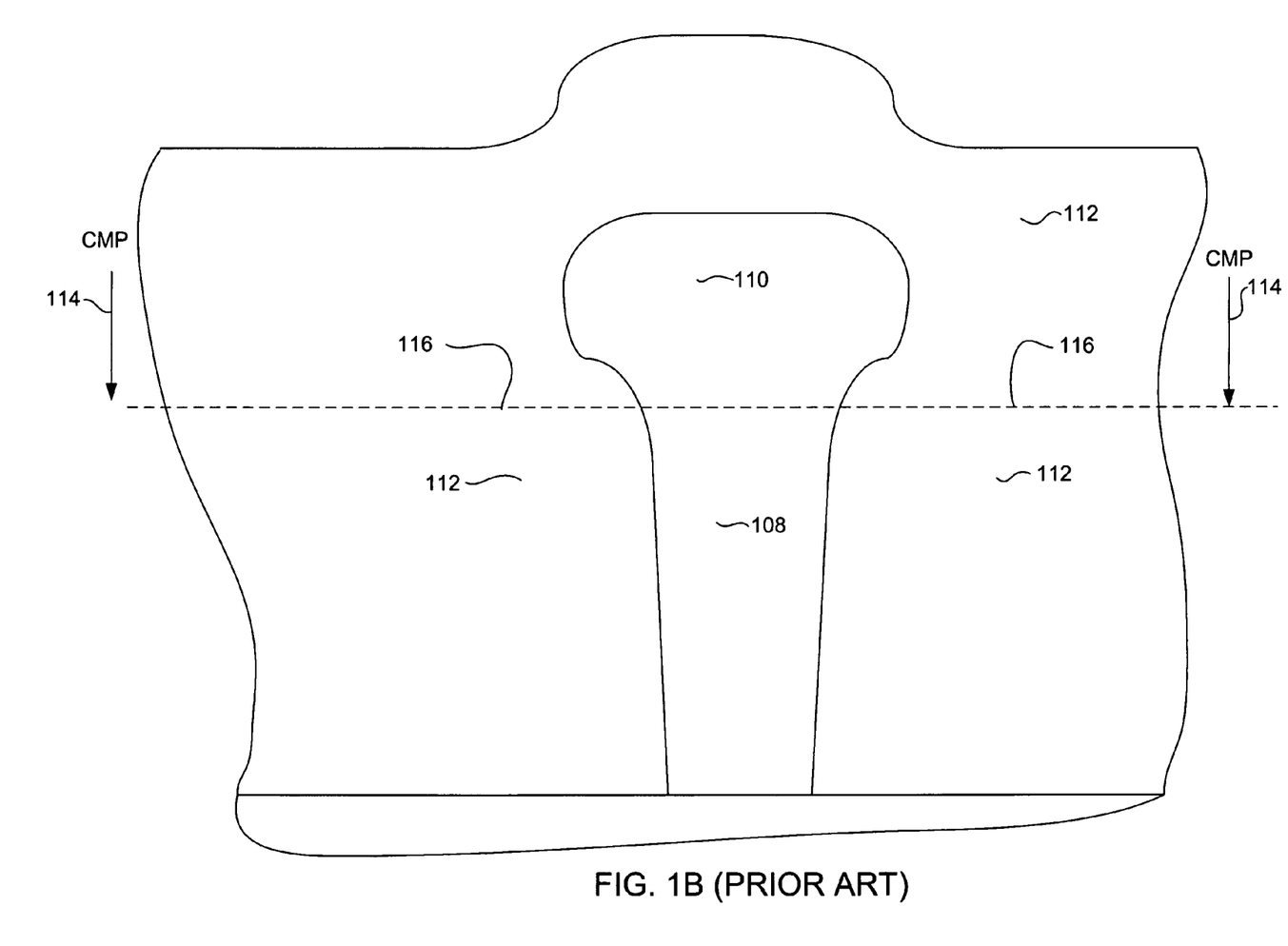
FIG. 1B is an ABS view of a prior art P2 pedestal of a magnetic head in an intermediate stage of manufacture.

With reference now to FIG. 1B, an alumina fill 112 is deposited to completely cover the magnetic material 108. A chemical mechanical polishing (CMP) process 114 is performed to remove the alumina opening up the top of the P2 pedestal, and bringing the magnetic material 110 down to the desired level 116 of the finished P2 pedestal. Those skilled in the art will appreciate that processes such as electroplating and chemical mechanical polishing non-uniformity across a wafer. Therefore, in order to assure that all P2 pedestals on a wafer are opened up by the CMP process, about 0.8 microns of additional P2 height must be plated just so that it may be then removed by the CMP. This additional P2 pole material, which must be removed by CMP significantly decreases throughput time. Plating time alone is increases by 25%, just to plate the additional 0.8 microns of P2 material, and the increased CMP requirement further increasing process time.

More importantly, the P2 height required by the CMP process prevent the use of Deep U.V. photolithography. If the additional P2 height were not necessary, the photoresist frame height would be shallow enough to allow the use of Deep U.V. lithography, which would result in tighter sigma (ie width variation) and a higher aspect ratio of the P2 pole, and a better track width definition.

Therefore, there is a strong felt need for a process for removing alumina material to open up a magnetic structure without necessitating the removal of a significant amount of the magnetic structure itself. Such a process would virtually eliminate the need to overplate the structure, would increase throughput time by decreasing process time, and would allow the use of more precise higher resolution lithographic techniques, resulting better defined, higher aspect ratio magnetic structures on write heads.

SUMMARY OF THE INVENTION

The present invention provides a method for constructing a magnetic structure on magnetic write head that reduces process time and results in improved dimension control and definition. A photoresist layer is patterned to form a trench. Then a magnetic material is plated into the trench. The photoresist layer is then removed and a dielectric layer such as for example alumina is deposited sufficient to cover the magnetic material. A chemical mechanical polishing process is then performed to remove a portion of the dielectric material. Thereafter, a reactive ion milling procedure is performed to remove additional dielectric material, opening up the magnetic material.

The present invention advantageously allows the magnetic material to be opened up from the dielectric material without requiring the removal of substantial amounts of the magnetic material, as would be necessary if using CMP alone to remove the dielectric material. This advantageously allows the magnetic structure to be plated essentially to its desired finished height, rather than requiring the plating of additional magnetic material that would later have to be removed. In addition, the process of the present invention improves process control by allowing the magnetic structure to be plated into a portion of a photoresist frame that has linear side wall, and not requiring the magnetic material to be plated up to the flared portion of the photoresist mask. This avoids shadowing effects that would be caused by a bulbous portion of the magnetic layer that would be formed if the magnetic layer were plated into the flared region. In addition, the present invention advantageously allows the use of deep U.V. photolithography by allowing the use of shallower photoresist frame that is more compatible with deep U.V. photolithography.

BRIEF DESCRIPTION OF THE DRAWINGS

For a fuller understanding of the nature and advantages of this invention, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out this invention. This description is made for the purpose of illustrating the general principles of this invention and is not meant to limit the inventive concepts claimed herein.

Figure 2:
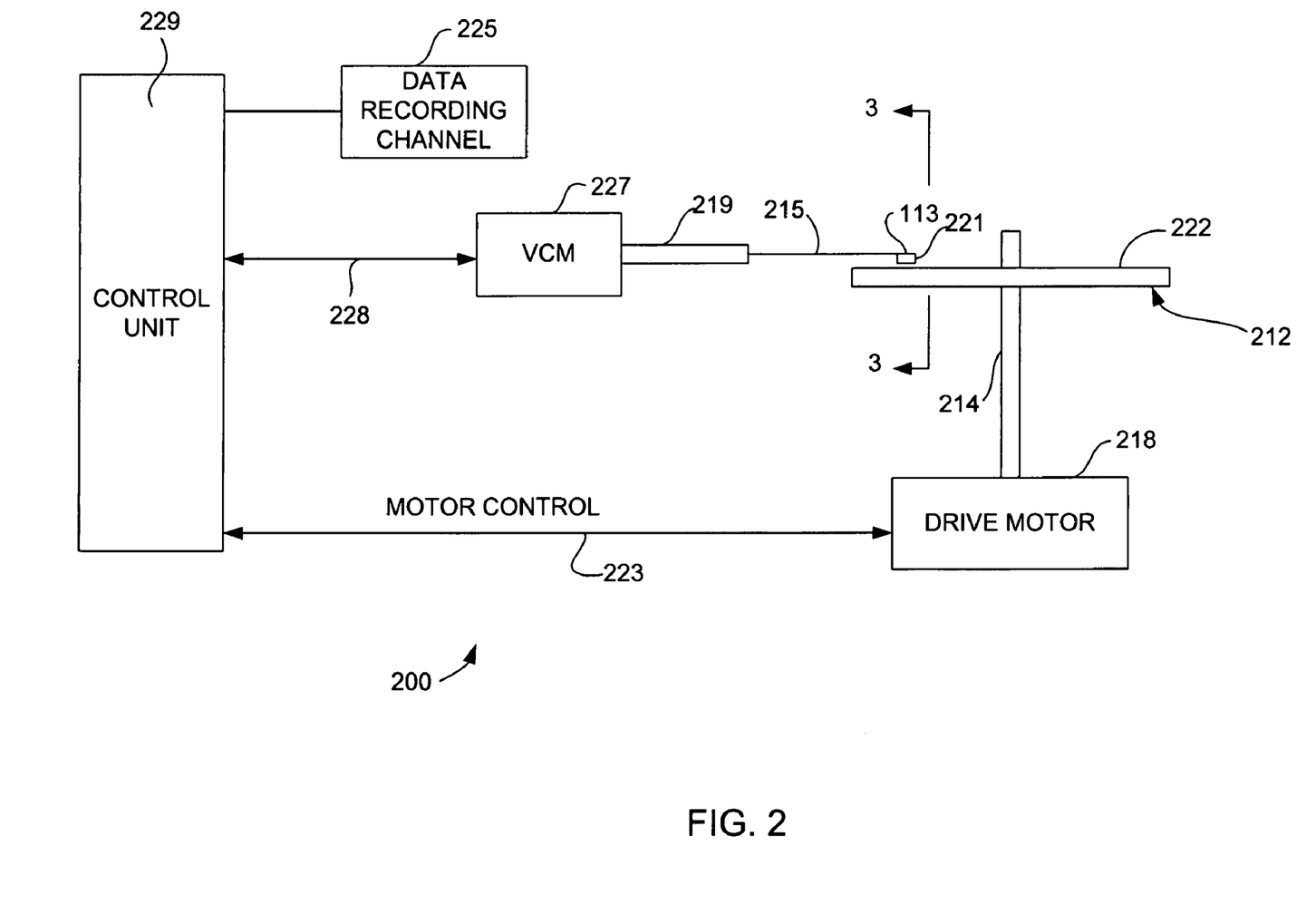
FIG. 2 is a schematic illustration of a magnetic data storage system in which the present invention may be embodied.

Referring now to FIG. 2, there is shown a disk drive 200 embodying this invention. As shown in FIG. 2, at least one rotatable magnetic disk 212 is supported on a spindle 214 and rotated by a disk drive motor 218. The magnetic recording on each disk is in the form of an annular pattern of concentric data tracks (not shown) on the magnetic disk 212.

At least one slider 213 is positioned near the magnetic disk 212, each slider 213 supporting one or more magnetic head assemblies 221. As the magnetic disk rotates, the slider 213 is moved radially in and out over the disk surface 222 so that the magnetic head assembly 221 may access different tracks of the magnetic disk where desired data are written. Each slider 213 is attached to an actuator arm 219 by way of a suspension 215. The suspension 215 provides a slight spring force which biases slider 113 against the disk surface 222. Each actuator arm 219 is attached to an actuator means 227. The actuator means 227 as shown in FIG. 2 may be a voice coil motor (VCM). The VCM comprises a coil movable within a fixed magnetic field, the direction and speed of the coil movements being controlled by the motor current signals supplied by controller 229.

During operation of the disk storage system, the rotation of the magnetic disk 212 generates an air bearing between the slider 213 and the disk surface 222 which exerts an upward force or lift on the slider. The air bearing thus counter-balances the slight spring force of suspension 215 and supports the slider 213 off and slightly above the disk surface by a small, substantially constant spacing during normal operation.

The various components of the disk storage system are controlled in operation by control signals generated by control unit 229, such as access control signals and internal clock signals. Typically, the control unit 229 comprises logic control circuits, storage means and a microprocessor. The control unit 229 generates control signals to control various system operations such as drive motor control signals on line 223 and head position and seek control signals on line 228. The control signals on line 228 provide the desired current profiles to optimally move and position slider 213 to the desired data track on disk 212. Write and read signals are communicated to and from write and read heads 221 by way of recording channel 225.

The above description of a typical magnetic disk storage system, and the accompanying illustration of FIG. 2 are for representation purposes only. It should be apparent that disk storage systems may contain a large number of disks and actuators, and each actuator may support a number of sliders.

Figure 3:
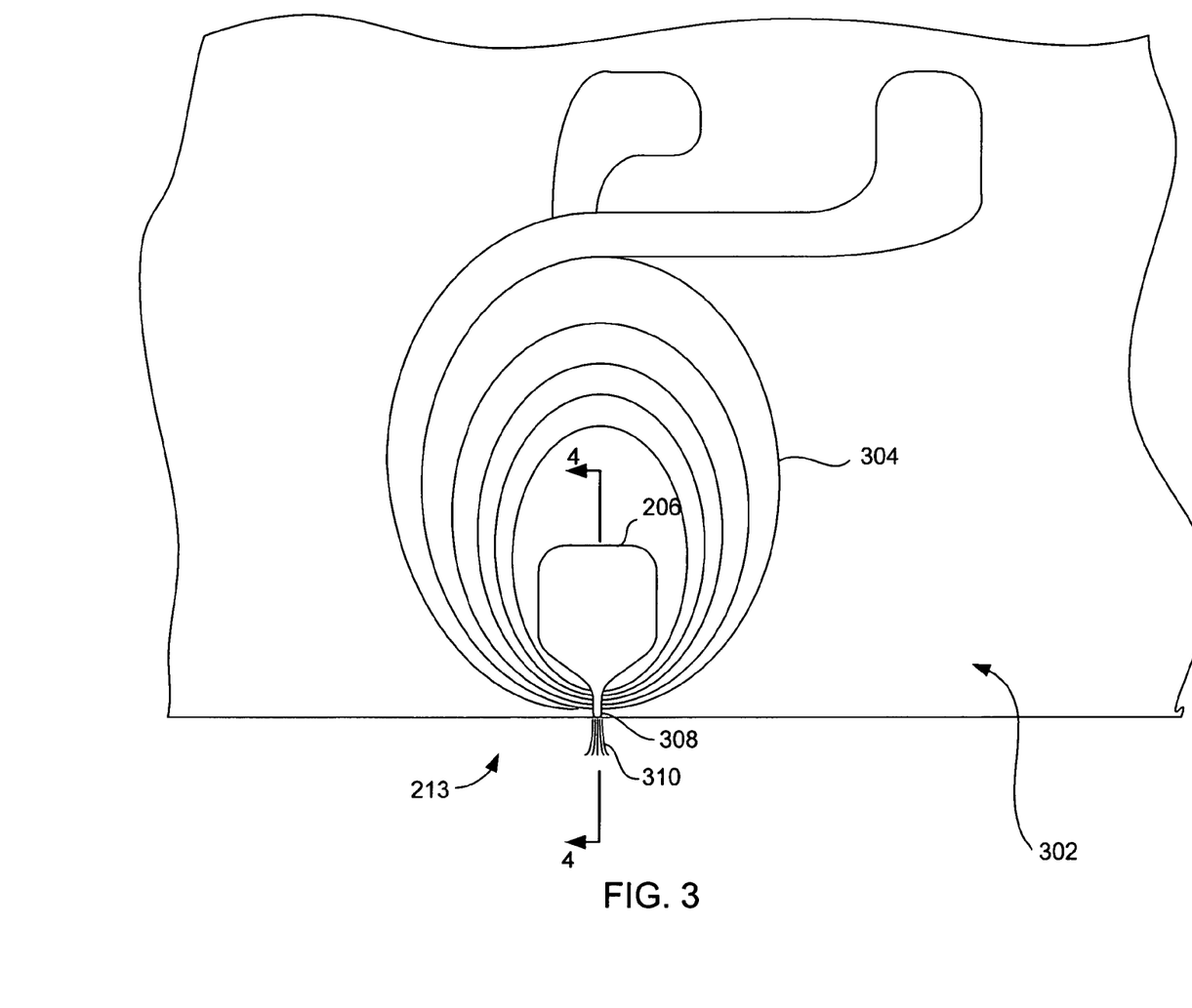
FIG. 3 is a plan view of a magnetic write head taken from view 4—4 of FIG. 3.

This invention provides a method of forming a write element. With reference to FIG. 3, a plan view of an exemplary write element 302, can be seen in relation to a slider 213. A coil 304, passing through a magnetic yoke 306, induces a magnetic flux in the yoke 306. The magnetic flux in the yoke 306, in turn causes a magnetic field to fringe out at the pole tip 308. It is this fringing field 310 that writes magnetic signals onto a nearby magnetic medium.

Figure 4:
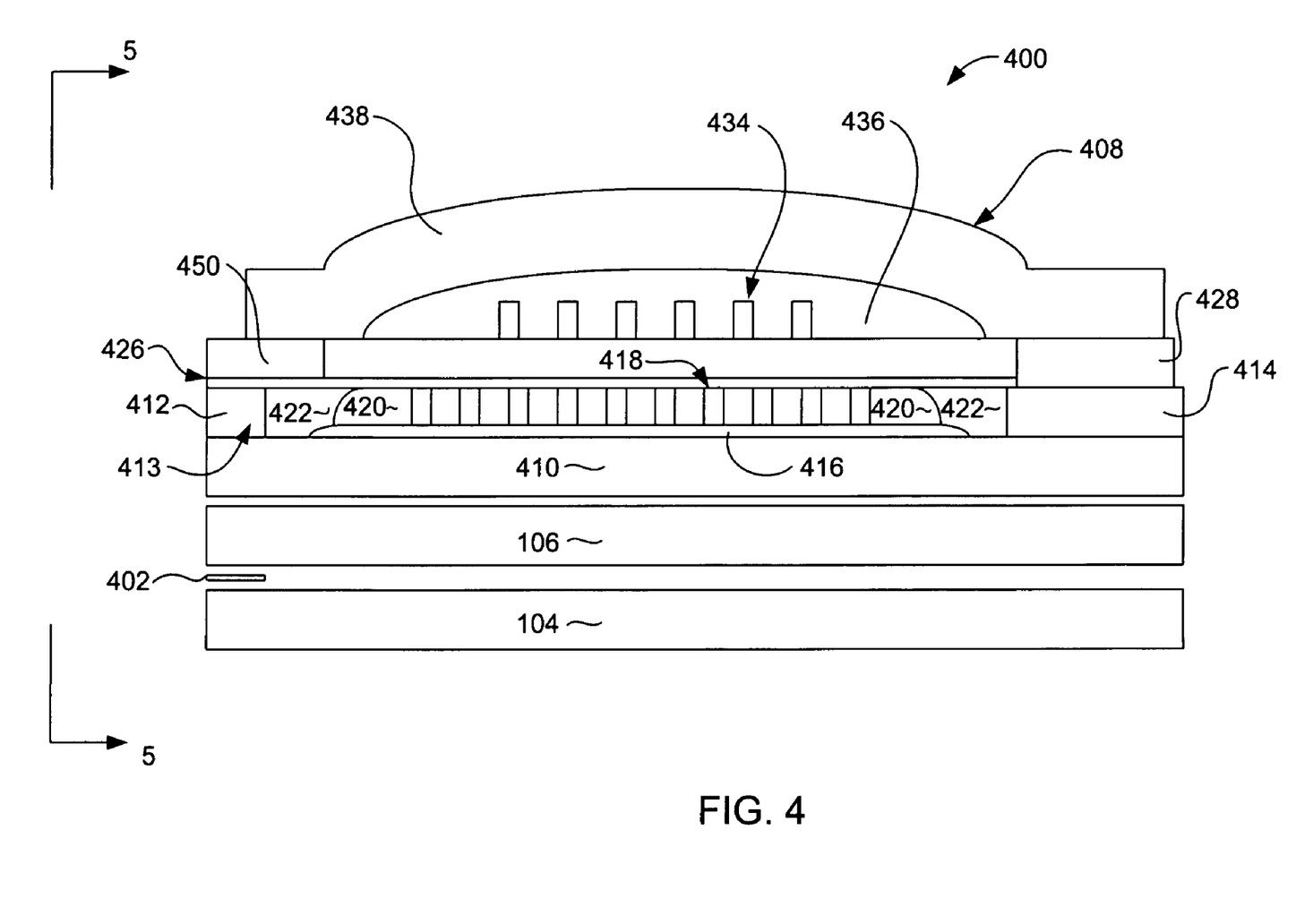
FIG. 4 is a cross sectional view of a magnetic write head according to an embodiment of the present invention.

With reference now to FIG. 4. a magnetic head 400 according to one possible embodiment of the present invention has magnetic read element 402 sandwiched between first an second magnetic shields 404, 406. A write head, generally referred to as 408, includes a first pole P1 410. A P1 pedestal 412 disposed in a pole tip region 413 and a first back gap layer 414, at an opposite end, are formed over the first pole. The first pole 410, P1 pedestal 412, and back gap 414 can be formed of a magnetic material such as for example NiFe. A first coil insulation layer 416 can be formed over the first pole 410 between the pedestal 412 and back gap 414. An electrically conductive coil 418, shown in partial cross section in FIG. 4, passes over the first pole 410 on top of the first insulation layer 416. A second coil insulation layer 420 insulates the turns of the coil 418 from one another and insulates the coil from the rest of the write head 408. A third insulation layer or fill 422 formed of a material such as alumina may be provided to fill the remainder of the area between the pedestal 412 and the back gap 414 and may extend into field areas (not shown).

With continued reference to FIG. 4, a thin layer of non-magnetic write gap material 424 can be deposited over the coil 418, insulation layers 420, 422, and P1 pedestal 412, and extends to an ABS surface 426 at one end and stops short of extending completely over the top of the back gap 414 at the other end. A magnetic second back gap material layer 428 may be formed over the top of the first back gap material layer 414, being magnetically connected therewith.

With continued reference to FIG. 4, a P2 pedestal 430 is provided on top of the write gap layer 424 in the pole tip region 413. The pedestal 430 extends to the ABS surface 426, and has a width (into the page of FIG. 4) that defines a track width of the write head 408. The P2 pedestal is constructed of a magnetic material, and is preferably constructed of a soft magnetic material having a high magnetic saturation (high Bsat), low coercivity and a high magnetic moment.

With reference still to FIG. 4, a dielectric fill material such as alumina extends from the P2 pedestal 430 to the second back gap layer 428. A second coil 434 sits atop the dielectric layer, and is insulated by an insulation layer 436, which could be for example hard baked photoresist. A P3 magnetic layer 438 is formed above the second coil 434 and insulation layer 436 and extends from the P2 pedestal to the second back gap layer 428 being magnetically connected with both. The P3 magnetic layer 408 forms the majority of a second pole of the magnetic yoke of the write head 408.

Figure 5:
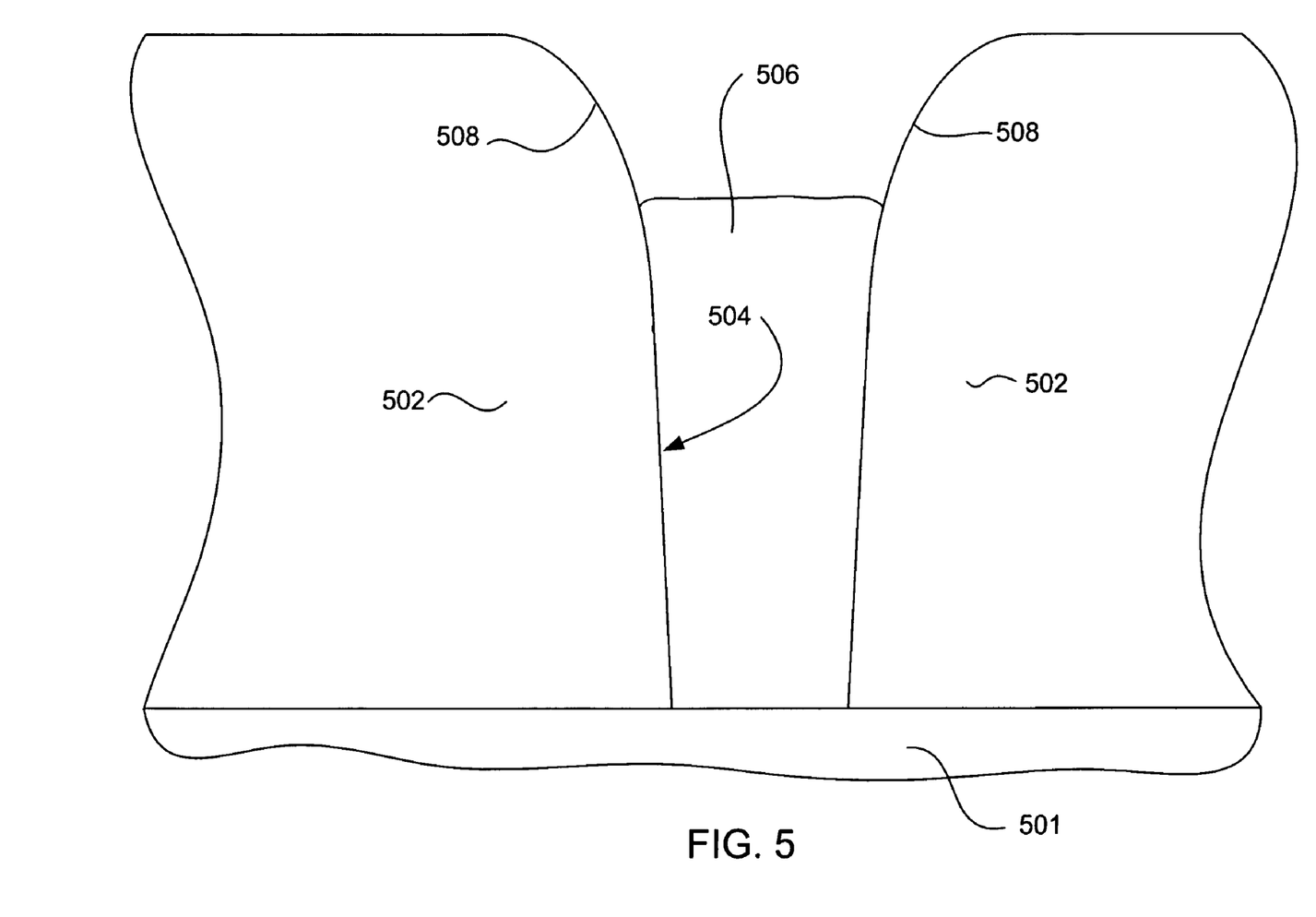
FIGS. 5–9 are views of a write head according to the present invention in various intermediate stages of manufacture.

With reference to FIGS. 5 through 9 a method of constructing P2 and P3 pedestal of a write head 408 or other magnetic structure according to an embodiment of the present invention will be described. With particular reference to FIG. 5 a photoresist frame 502 is plated onto a substrate 501. The photoresist frame 502 includes a trench 504 preferably having a width no greater than 0.3 um, and an aspect ratio of at least 15:1. Aspect ratio refers to the ratio of height to width. The photoresist frame is preferably formed by a deep ultraviolet (deep U.V.) photolithography, but could also be constructed by other means such as I-line and e-beam photolithography.

A magnetic material 506, such as NiFe is then plated into the trench 504. The magnetic material is preferably a high saturation high Bsat material such as NiFe, CoFe, CoNiFe, or could be a lamination of multiple magnetic layers such as NiFe or CoFe separated by thin layers of non magnetic material. It should be pointed out that the magnetic material 506 is preferably plated only partially to the top of the trench 504, stopping short of the flared section 508 of the trench. This advantageously avoids forming a bulbous upper portion of the magnetic material 506. Such a bulbous upper portion, as has been formed on prior art magnetic layers, would deleterious shadowing effects during later photolithography and ion milling procedures. After, the magnetic material 506 has been plated, the photoresist frame can be lifted off by techniques familiar to those skilled in the art.

Figure 6A:
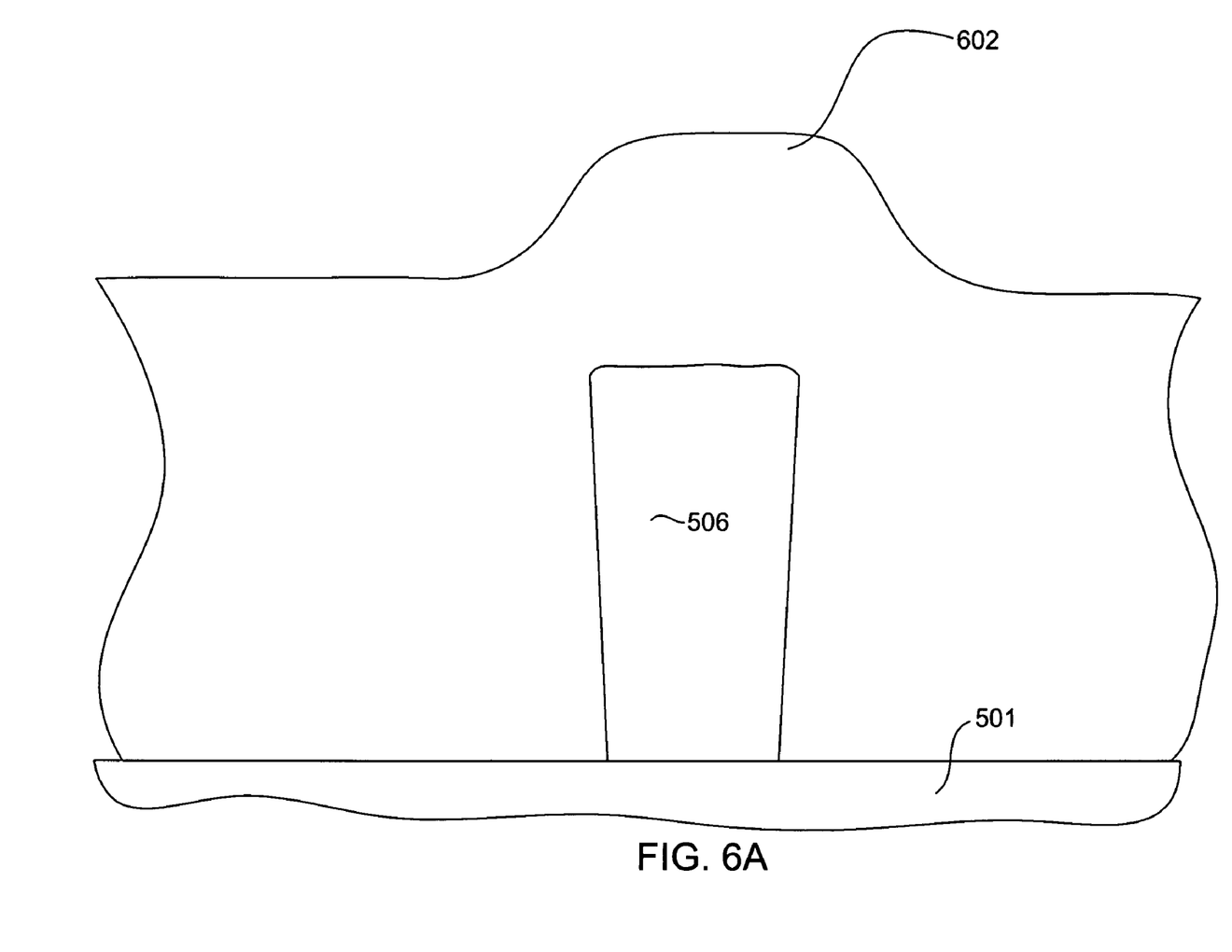
Figure 6B:
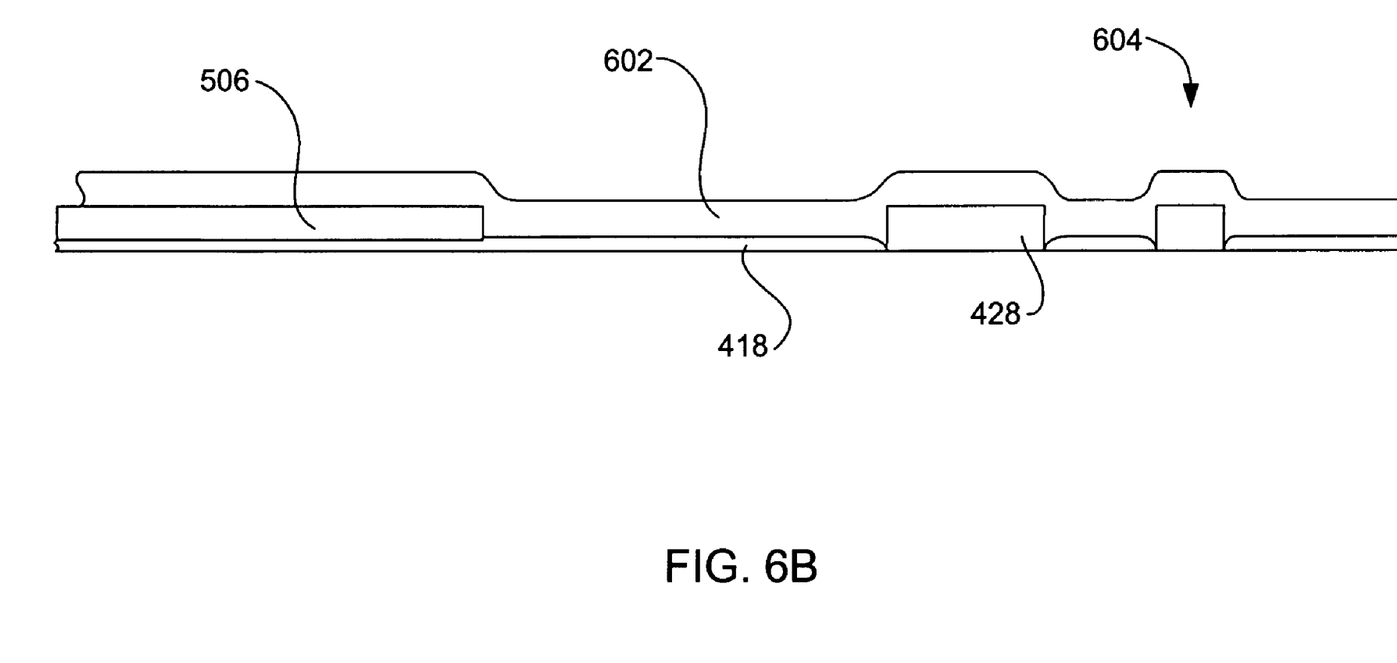
Figure 7:
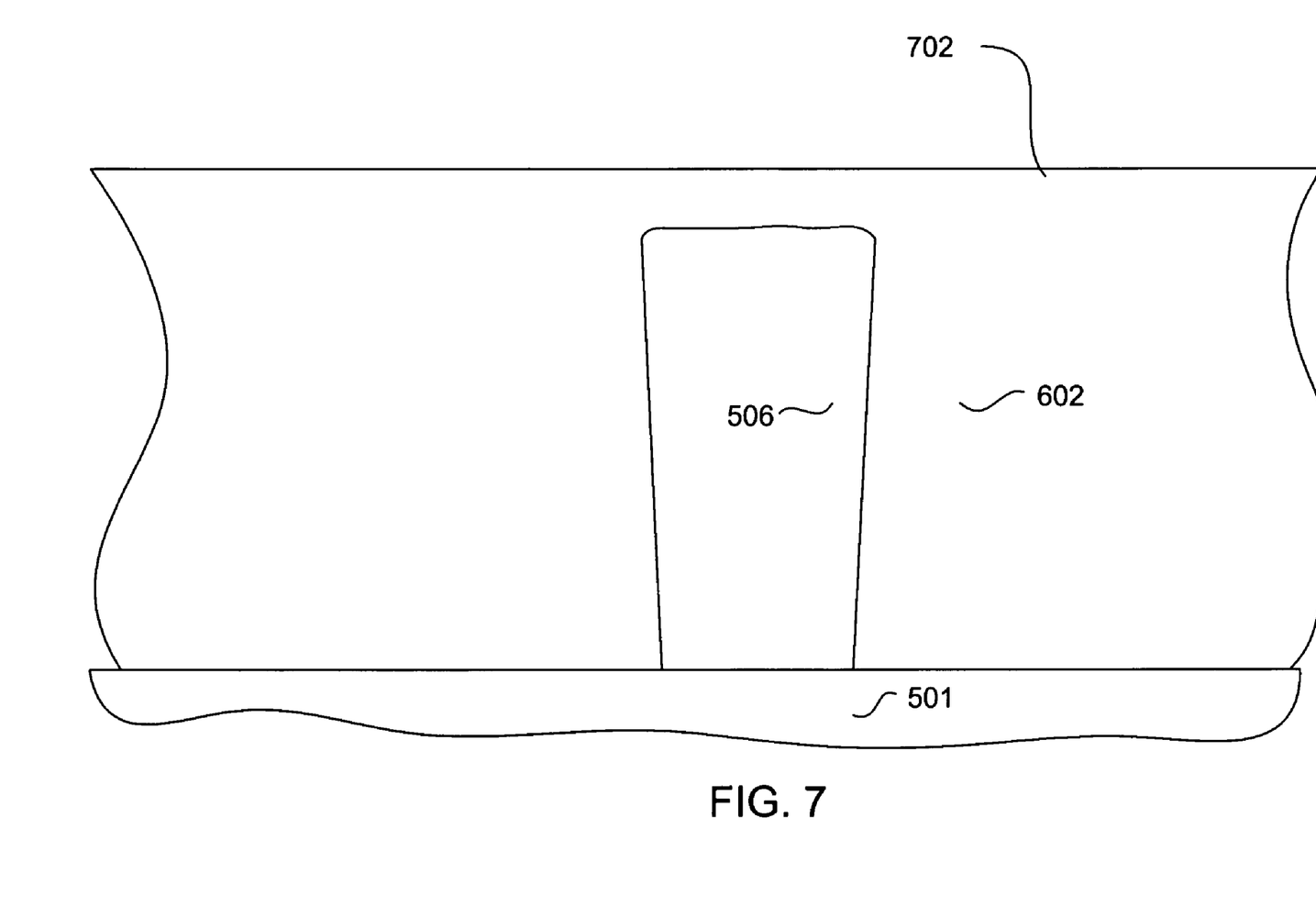

With reference now to FIGS. 6A and 6B, a full film dielectric layer, such as alumina 602 is deposited. As can be seen with reference to FIG. 6B the alumina layer 602 covers the entire magnetic write head formed thus far and extends into the field areas 604. With reference now to FIG. 7, a chemical mechanical polishing process is performed to form a planar upper surface 702. According to the present invention, the CMP process can be terminated prior to reaching the first magnetic layer 506. However, the uncovering of one or more magnetic layers 506 on a wafer during the CMP process will not result in any deleterious effects and would be considered to fall within the scope of the invention. It should also be appreciated that the magnetic material layer 506 is being described herein in terms of the construction of a P2 pedestal. However, the methods of the present invention could be used to form other magnetic structures and would still fall within the scope of the invention.

Figure 8:
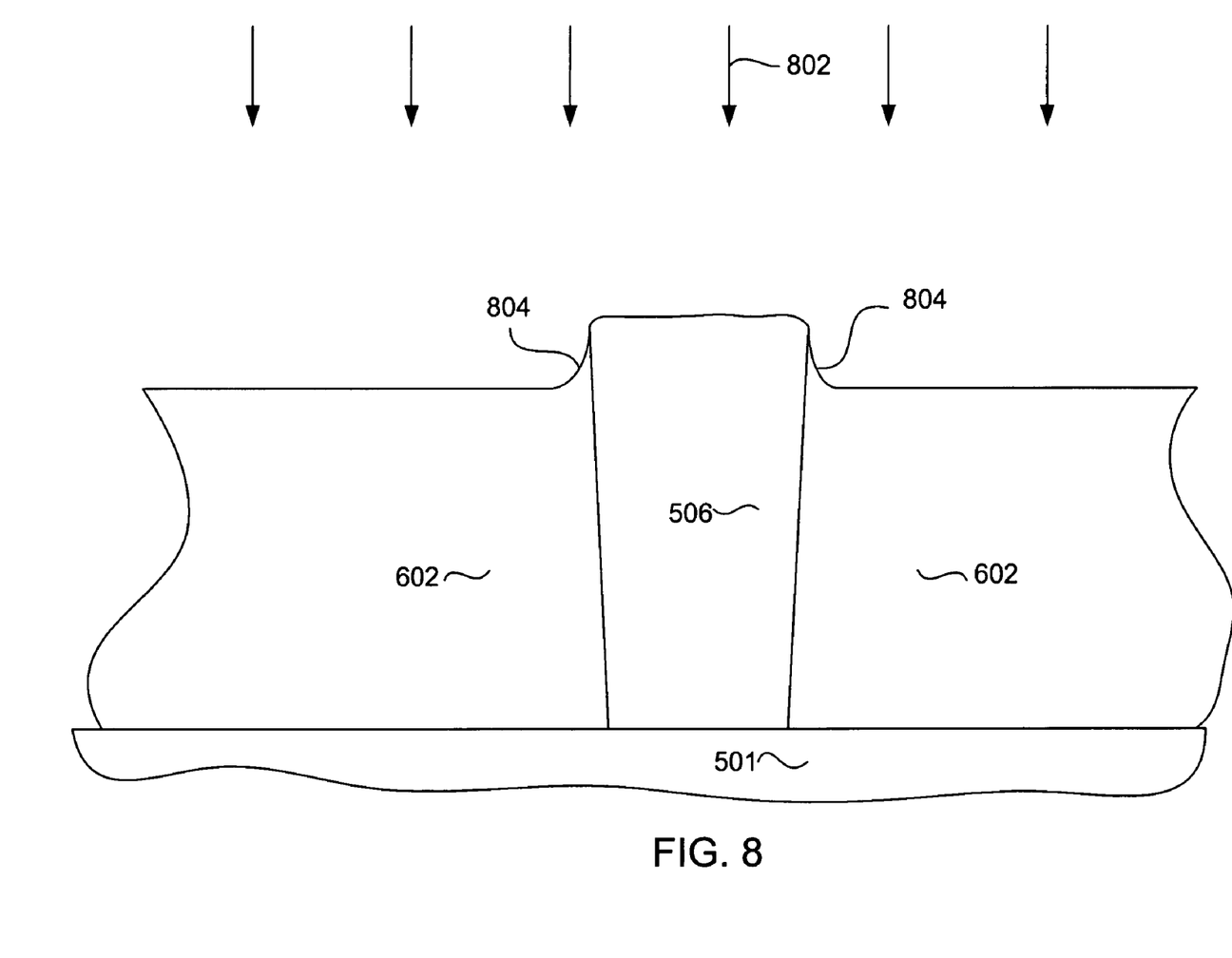
Figure 9:
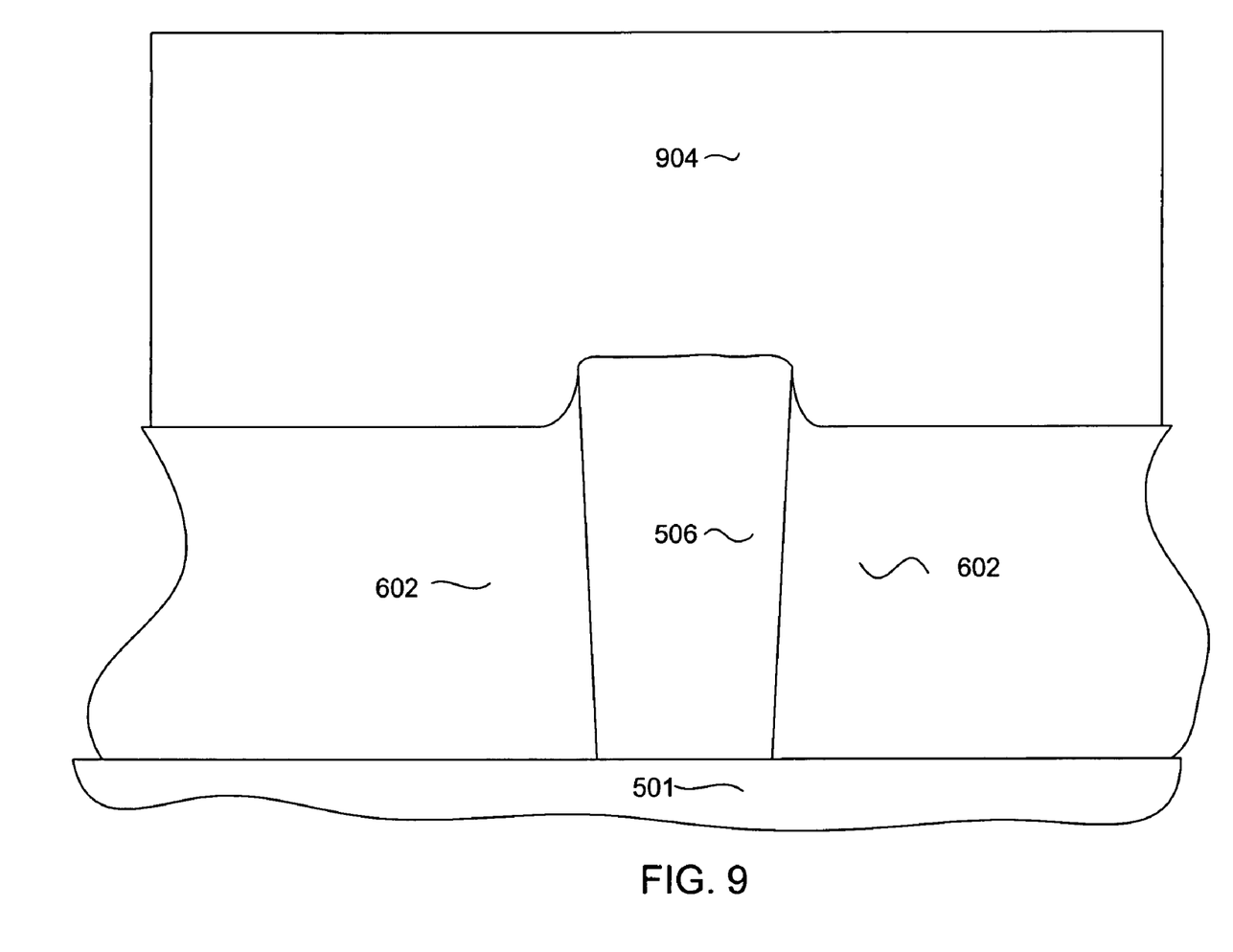

With reference now to FIG. 8, a reactive ion milling operation 802 is performed. The reactive ion milling operation is preferably performed in a CHF3 atmosphere, however, those skilled in the art may find other reactive ion milling operations that work also and would fall within the scope of the invention. The reactive ion milling operation advantageously reacts much more selectively with the alumina 602 than with the magnetic layer 506 (alumina to NiFe~7:1). The reactive ion milling could be performed sufficiently to create recess 804 of approximately 0.3 microns. As can be seen the reactive ion milling operation removes the last bit of alumina virtually assuring that all magnetic structures 506 on a wafer have been opened up, without the necessity of removing excessive amounts of NiFe by CMP. This very advantageously allows the as plated magnetic structure 506 to be plated much shallower than would otherwise be possible. With reference now to FIG. 9, another magnetic structure 904 can be plated onto the magnetic layer 506, with excellent magnetic contact between the two layers 506, 902. The magnetic structure 904 could be for example, a P3 layer plated onto the magnetic layer 506, which could be the P2 pedestal 412.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for manufacturing a magnetic structure on a magnetic write head, comprising:
    constructing a photoresist layer having a trench, the trench being formed with a flared portion near the top of the trench;
    depositing a magnetic material into the trench;
    removing, the photoresist layer;
    depositing a dielectric material;
    first performing a chemical mechanical polish to remove a portion of said dielectric material;
    then, after performing a chemical mechanical polish to remove a portion of said dielectric material, performing a reactive ion mill procedure to remove a further portion of the dielectric material the reactive ion mill being performed sufficiently to expose said magnetic material, the ion milling being performed in a chemistry to preferentially remove the dielectric material, leaving the magnetic material relatively unaffected.

2. A method as in claim 1 further comprising forming a magnetic pole structure over the exposed magnetic material.

3. A method as in claim 1 wherein said constructing a photoresist trench further comprises:
    depositing photoresist; and
    performing a deep ultraviolet photolithography on the photoresist.

4. A method as in claim 1, wherein said depositing said magnetic material comprises electroplating.

5. A method as in claim 1, wherein said depositing said magnetic material comprises electroplating said magnetic material, and terminating said electroplating before said magnetic material reaches an upper opening in said trench formed in said photoresist layer.

6. A method as in claim 1, wherein said trench includes a flared portion, and wherein said depositing said magnetic material comprises electroplating said magnetic material, and terminating said electroplating before said magnetic material reaches said flared portion formed in said trench.

7. A method as in claim 1, wherein said magnetic material comprises NiFe.

8. A method as in claim 2, wherein said magnetic pole structure comprises NiFe.

9. A method as in claim 1, wherein said reactive ion milling procedure forms a recession of between 0 and 0.3 microns between said magnetic structure and an upper surface of said alumina.

10. A method as in claim 1 wherein said magnetic structure has a width sigma of less than 10 nanometers.

11. A method as in claim 1 wherein said trench formed in said photoresist layer has a width sigma of less than 10 nanometers up to a location where said magnetic material deposition will terminate.

12. A method as in claim 1 wherein said dielectric material is alumina ($Al_2O_3$).

13. A method as in claim 1 wherein said magnetic structure is a P3 pedestal of a magnetic pole.

14. A method as in claim 1 wherein said reactive ion mill is performed in an atmosphere comprising $CHF_3$.

15. A method as in claim 1 wherein said reactive ion mill is performed sufficiently to create a recess between an upper surface of said magnetic structure and an upper surface of said dielectric material.

16. A method as in claim 1 wherein said reactive ion mill creates a recess between an upper surface of said magnetic layer and an upper surface of said dielectric layer wherein said recess is between 0.1 and 0.3 microns inclusive.

17. A method as in claim 1 wherein said reactive ion mill creates a recess between an upper surface of said magnetic layer and an upper surface of said dielectric layer wherein said recess is about 0.3 microns.

* * * * *

UNITED STATES PATENT AND TRADEMARK OFFICE
CERTIFICATE OF CORRECTION

PATENT NO. : 7,217,666 B2  Page 1 of 1
APPLICATION NO. : 10/792330
DATED : May 15, 2007
INVENTOR(S) : Guthrie et al.

It is certified that error appears in the above-identified patent and that said Letters Patent is hereby corrected as shown below:

In claim 1, column 6, line 41 between "removing" and "the photoresist", please delete the ",".

Signed and Sealed this

Fifteenth Day of June, 2010

David J. Kappos
*Director of the United States Patent and Trademark Office*